US010048297B2

(12) United States Patent
Motz

(10) Patent No.: US 10,048,297 B2
(45) Date of Patent: Aug. 14, 2018

(54) METHOD AND APPARATUS FOR MEASURING A DISTURBED VARIABLE

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/724,784

(22) Filed: May 28, 2015

(65) Prior Publication Data

US 2017/0115330 A1  Apr. 27, 2017

(30) Foreign Application Priority Data

May 28, 2014 (DE) .................. 10 2014 107 540

(51) Int. Cl.
*G01R 19/00* (2006.01)
*G01R 31/34* (2006.01)
*G01R 1/30* (2006.01)

(52) U.S. Cl.
CPC .......... *G01R 19/0053* (2013.01); *G01R 1/30* (2013.01); *G01R 19/003* (2013.01); *G01R 19/0092* (2013.01); *G01R 31/343* (2013.01)

(58) Field of Classification Search
None
See application file for complete search history.

(56) References Cited

U.S. PATENT DOCUMENTS

| 5,396,447 A * | 3/1995 | Suntken ............... G01R 21/127 708/7 |
| 6,831,576 B2 * | 12/2004 | Geiger ................ H03M 1/0639 341/131 |
| 7,148,828 B2 | 12/2006 | Fernandez et al. |
| 7,315,157 B2 * | 1/2008 | Chapuis ............... H02M 3/157 323/282 |
| 7,656,933 B2 | 2/2010 | Klinke et al. |
| 7,961,128 B2 * | 6/2011 | Kim ..................... H03K 3/3565 341/143 |
| 2004/0135713 A1 | 7/2004 | Geiger et al. |
| 2007/0057830 A1 * | 3/2007 | Wiesbauer ............... H03L 7/08 341/126 |
| 2011/0115729 A1 * | 5/2011 | Kremin ................. G06F 3/0418 345/173 |

(Continued)

FOREIGN PATENT DOCUMENTS

| CN | 1606773 A | 4/2005 |
| CN | 1859009 A | 11/2006 |

(Continued)

OTHER PUBLICATIONS

Yan, S. and Sanchez-Sinencio, E., "Broadband Continuous-Time-Delta Analog-to-Digital Conversion using MOSIS AMI 0.5 μm CMOS Technology, A Research/Educational Proposal", Department of Electrical Engineering Analog and Mixed Signal Center, Texas A&M University, College Station, Jun. 29, 2001.*

*Primary Examiner* — Joseph Schoenholtz
(74) *Attorney, Agent, or Firm* — Shumaker & Sieffert, P.A.

(57) ABSTRACT

Provided are apparatuses and methods, in which a disturbed measurement variable is converted to a digital signal. The digital signal is then averaged over a number of sampling values which corresponds to a period of the disturbances.

20 Claims, 5 Drawing Sheets

(56) References Cited

U.S. PATENT DOCUMENTS

| | | | | |
|---|---|---|---|---|
| 2011/0156625 A1* | 6/2011 | Kurosawa | ............... | G11B 19/28 |
| | | | | 318/400.09 |
| 2014/0191743 A1* | 7/2014 | O'Driscoll | ............ | H02M 3/156 |
| | | | | 323/282 |
| 2015/0035691 A1* | 2/2015 | Chiricosta | ........... | H03M 1/0626 |
| | | | | 341/155 |
| 2016/0365213 A1* | 12/2016 | Zettler | ................ | G01R 31/2829 |

FOREIGN PATENT DOCUMENTS

| | | |
|---|---|---|
| CN | 102137412 A | 7/2011 |
| CN | 103631161 A | 3/2014 |
| DE | 10252756 A1 | 5/2004 |

* cited by examiner

METHOD AND APPARATUS FOR MEASURING A DISTURBED VARIABLE

TECHNICAL FIELD

The present application relates to methods and apparatuses for measuring disturbed variables, in particular voltages or currents, which are affected by a periodic disturbance.

BACKGROUND

In many applications, it is desirable to measure a variable, for example a current or a voltage, and to carry out open-loop or closed-loop control based on this measurement. One example of this is measuring a current in an electric motor, wherein the electric motor is in turn controlled on the basis of the current measurement. Another application is measuring currents in rectifiers, for example for solar cells. In such apparatuses, periodic control signals are used, for example for driving the motor or for controlling the rectification. These periodic control signals can cause periodic disturbances in signals to be measured, with the result that, for example in the case of a current or voltage measurement, a signal that is subject to a periodic disturbance is measured. For many applications, these periodic disturbances in the measured signal can be undesired. In addition to the periodic disturbances, it is also possible for individual peaks to occur in the measured signal, which are caused by the control signals and can likewise be undesired. In other applications, a signal of interest can also be superposed by periodic disturbances.

Various traditional solutions have various disadvantages, such as for example a sensitivity to voltage or current peaks or relatively high delays, wherein such high delays can result in instabilities for example in the case of control loops.

It is therefore an object of the present application to provide options for being able to measure a disturbed variable such as for example a current with as little delay as possible.

BRIEF SUMMARY

Provided is an apparatus according to claim 1 and a method according to claim 14. The dependent claims define further exemplary embodiments.

DETAILED DESCRIPTION

Exemplary embodiments of the present invention will be explained in detail below. It should be noted that these exemplary embodiments merely serve as examples and should not be understood to be limiting.

Even if some exemplary embodiments are described as having a large number of properties or features, this should not be understood to mean that these properties or features are essential. Different exemplary embodiments can have fewer features or properties and/or alternative features or properties. In addition, features of different exemplary embodiments can be combined with one another, unless indicated otherwise.

In some exemplary embodiments, a signal which is subject to a periodic disturbance is digitized with a sampling frequency, in particular converted to multibit sampling values. Averaging over a number of multibit sampling values is then carried out, which corresponds to the period duration of the disturbance or an integer multiple thereof.

In some exemplary embodiments, such averaging can begin a number of times with time offset in each period of the disturbances. In some exemplary embodiments it is thus possible to reduce a delay which is produced by the averaging.

Examples of the above-explained concepts are explained in more detail below with reference to the figures.

Figure 1:
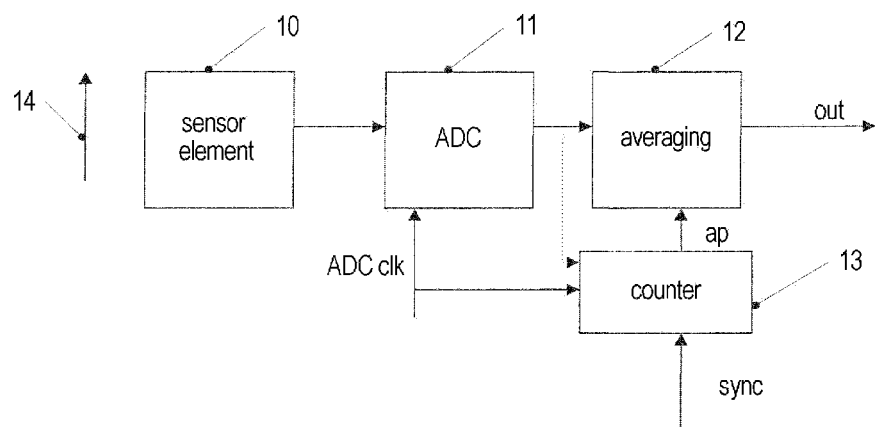
FIG. 1 is a block diagram showing an apparatus according to an exemplary embodiment.

FIG. 1 is a block diagram representing an apparatus according to an exemplary embodiment. The apparatus of FIG. 1 comprises a sensor element 10 for capturing a variable to be measured, which is represented schematically by an arrow 14. The variable to be measured can be, for example, a current. In this case, the sensor element 10 can be any conventional current measuring element, for example a sensor element based on measuring magnetic fields, such as a Hall sensor or a magnetoresistive element, or a sensor element which measures a voltage drop across a defined resistance. In other exemplary embodiments, the measurement variable 14 is a different variable, for example a voltage, a mechanical variable such as for example a pressure or a force, or some other variable of interest. An output signal of the sensor element 10, which gives the variable to be measured in analog form, is digitized by an analog-to-digital converter (ADC) 11. In some exemplary embodiments, the analog-to-digital converter 11 is here a multibit converter, i.e. it outputs n-bit values as output sampling values, wherein n>1. The analog-to-digital converter 11 is operated with a converter clock signal ADCclk, which determines the sampling rate of the analog-to-digital converter 11. The analog-to-digital converter 11 can be, for example, a sigma-delta analog-to-digital converter, for example a continuous-time sigma-delta analog-to-digital converter.

In the exemplary embodiment of FIG. 1, the measurement variable 14 is a disturbed measurement variable, wherein the disturbances comprise periodic disturbances having a period duration. Such periodic disturbance signals can be caused for example by the operation of a device in which the measurement variable 14 is measured. By way of example, control signals for an electric motor or for a rectifier can cause corresponding periodic disturbances. Such periodic disturbances produced by control signals will be explained in more detail below with reference to FIG. 3. However, the use of the techniques and exemplary embodiments described here is not limited to periodic disturbances caused by control signals. For example, measuring magnetic field signals according to what is known as the spinning-current Hall sensor principle can produce periodic offset-ripple signals (for example in a 4-phase current spinning technique) as periodic disturbance signals. Periodic disturbances can also be produced during amplification of a signal with a chopper amplifier.

The values output by the analog-to-digital converter 11 are averaged in an averaging device 12, wherein a number of sampling values over which averaging is performed corresponds to a period duration or an integer multiple thereof. Averaged values which are ascertained in this way are output as the output signal out.

In the exemplary embodiment of FIG. 1, the averaging device 12 here receives a signal ap from a counter 13, wherein the signal ap gives a number of sampling values corresponding to the period duration over which the averaging is to be performed. The counter 13 here ascertains the value ap on the basis of the converter clock signal ADCclk and a synchronization signal sync, which has a period corresponding to the periods of the disturbances. Such signals, which can serve as the synchronization signal sync, are already present in many devices in which such periodic disturbances occur and serve, for example, for controlling such a device. The counter 13 here counts the number of periods of the converter clock signal ADCclk during a period of the synchronization signal sync. In other exemplary embodiments, the value ap can be ascertained on the basis of the signal that is measured by the sensor element 10, for example by analyzing the signal output by the analog-to-digital converter 11. This is indicated by a dotted arrow in FIG. 1. In this case, the counter 13 can count for example the number of periods of the converter clock signal ADCclk during a disturbance period output signal of the analog-to-digital converter 11. If appropriate, this can be carried out over a plurality of disturbance periods so as to obtain a reliable value. In other exemplary embodiments, the value ap can be specified based on a system design.

It should be noted that, in addition to averaging over a duration corresponding to a disturbance period, longer averaging, for example over an integer multiple of the disturbance period, can also be carried out. It should additionally be noted that even though the number of sampling values over which averaging is carried out in the exemplary embodiment of FIG. 1 corresponds to a period of the disturbance, the beginning of the averaging does not need to be synchronized with the beginning of the disturbance. In addition, as will be explained in more details below with reference to FIGS. 4 and 5, it is also possible to carry out a plurality of averagings with time offset so as to output output values with a higher frequency than would correspond to the period of the disturbance.

Figure 2:
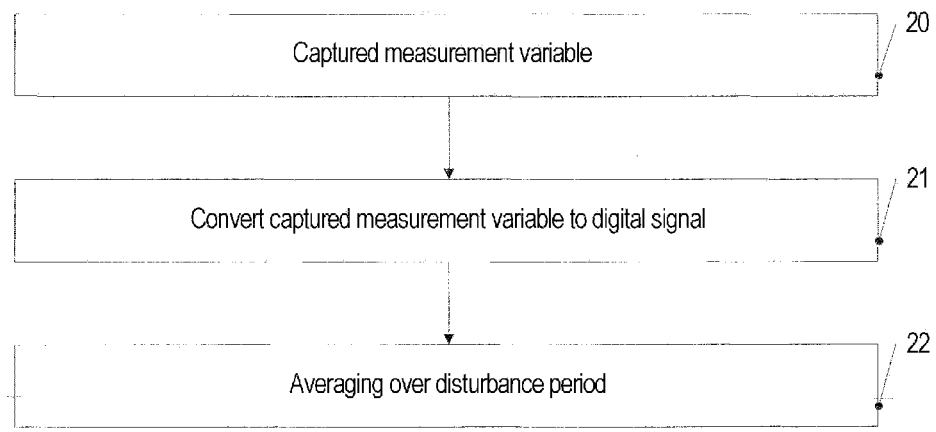
FIG. 2 is a flowchart for illustrating a method according to an exemplary embodiment.

FIG. 2 represents a flowchart for illustrating a method according to an exemplary embodiment. The represented order of method steps should not be understood to be limiting. In particular, represented method steps can be carried out multiple times periodically or even simultaneously in different circuit parts. The method in FIG. 2 can be carried out for example in the apparatus of FIG. 1 or in the apparatus of FIG. 4, which will be discussed below, but is not limited hereto.

At 20, a measurement variable is captured, for example a current. At 21, the captured measurement variable is then converted into a digital signal, for example a multibit signal with a multiplicity of successive n-bit sampling values, wherein n>1. At 22, the sampling values of the digital signal are then averaged over a duration of a period of a disturbance in order to generate an output signal. The beginning of the averaging in this case does not need to coincide with the beginning of a disturbance period of a disturbance signal which is superposed over the measurement variable, but merely the duration substantially matches.

It is also possible to carry out a plurality of averagings with a time offset and partial overlap in order to update the output signal thus generated more frequently. In some exemplary embodiments, this can result in a smaller delay of the output signal, which is useful for example in applications in which the measurement variable is controlled on the basis of the output signal.

Figure 3:
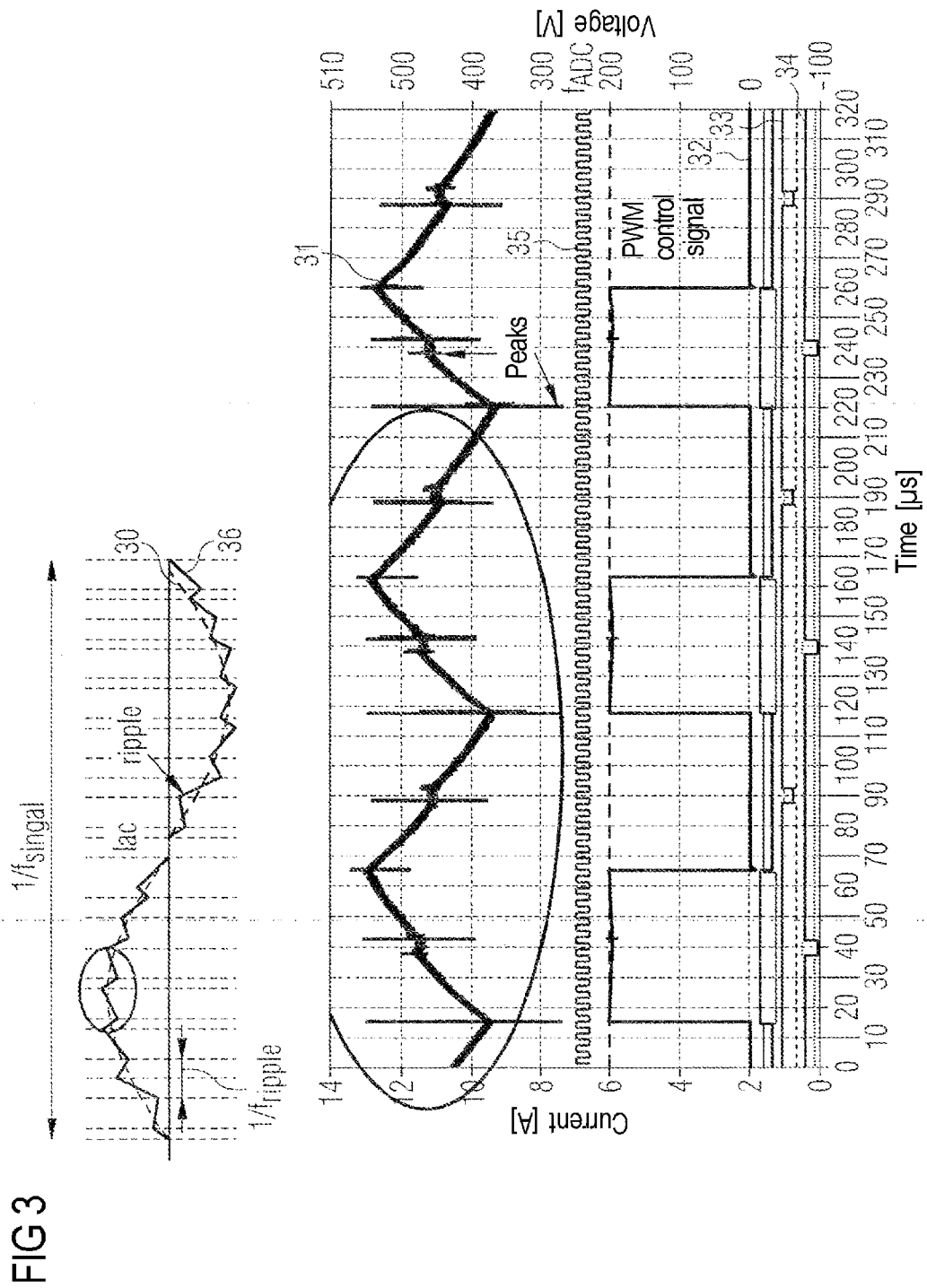
FIG. 3 shows signals for illustrating exemplary embodiments.

In order to explain the apparatus of FIG. 1 and the method of FIG. 2 in more detail, FIG. 3 shows a few signals for example of a motor control means, in which a motor is controlled with a pulse-width-modulated (PWM) control signal 32. Furthermore used for controlling the motor are synchronization signals 33, 34, the period duration of which corresponds to the period of the pulse-width-modulated control signal 32. The pulse-width-modulated control signal 32 is used, for example, to increase or decrease a motor current. At a high value (for example 200 V) of the control signal 32, for example a current in a motor increases, and at a low value (for example 0 V) it drops, which results in the triangular shape of the curve 31. A dashed curve 30 here shows a sinusoidal signal, which corresponds to an alternating current of interest, and a solid curve 36 shows the signal with disturbances, also referred to as "ripples," which are caused in the signal by the pulse-width-modulated control signal, with the result that first a disturbed signal according to the solid curve 36 is present. This disturbed signal can be captured, for example, by a current sensor such as a Hall sensor. However, for some applications, the signal according to the curve 30 is of interest. By way of example, the sinusoidal signal according to the curve 30 can be used for purposes of closed loop control, for example for closed loop control of the motor. The signal corresponding to the curve 30 can also be referred to as a base signal, which is superposed by disturbances, with the result that a signal corresponding to the curve 36 is produced.

An enlarged section of this solid curve 36 is shown at 31, where the triangular "ripple" together with peaks which are caused, for example, by switching the pulse-width-modulated control signal 32 on and off or by the synchronization signals 33, 34 are represented. The synchronization signals 33 and 34 have a frequency equal to a frequency of the control signal 32 and thus a frequency of the disturbances for example corresponding to the curve 31 or the solid curve 30. This triangular signal represents an example of a periodic disturbance signal to which the actual measurement variable (dashed curve 30) is subject. By averaging, as was discussed with reference to FIGS. 1 and 2, the influence of the disturbance signal can be eliminated or at least reduced.

In addition, for illustration purposes in FIG. 3, 35 designates a clock signal of an analog-to-digital converter like the analog-to-digital converter 11 of FIG. 1, which has a frequency $f_{ADC}$. In the exemplary signals of FIG. 3, the counter 13 would count for example the number of periods of the analog-to-digital converter clock signal 35 between two pulses of one of the synchronization signals 33, 34 in order to therefore ascertain the period duration of the disturbances or the number of sampling values ap over which averaging is carried out. While the synchronization signals 33, 34 in the represented example have pulses with a spacing of a period duration of the disturbances in order to give information relating to the period duration, in different exemplary embodiments such pulses can also have spacings which are a multiple or a fraction of the period duration, which likewise represents information relating to the period duration.

A clock frequency of the signal 35 is here significantly larger than a frequency of the PWM control signal 32 or the synchronization signals 33, 34, for example between 10 and 20 times as large.

Figure 4:
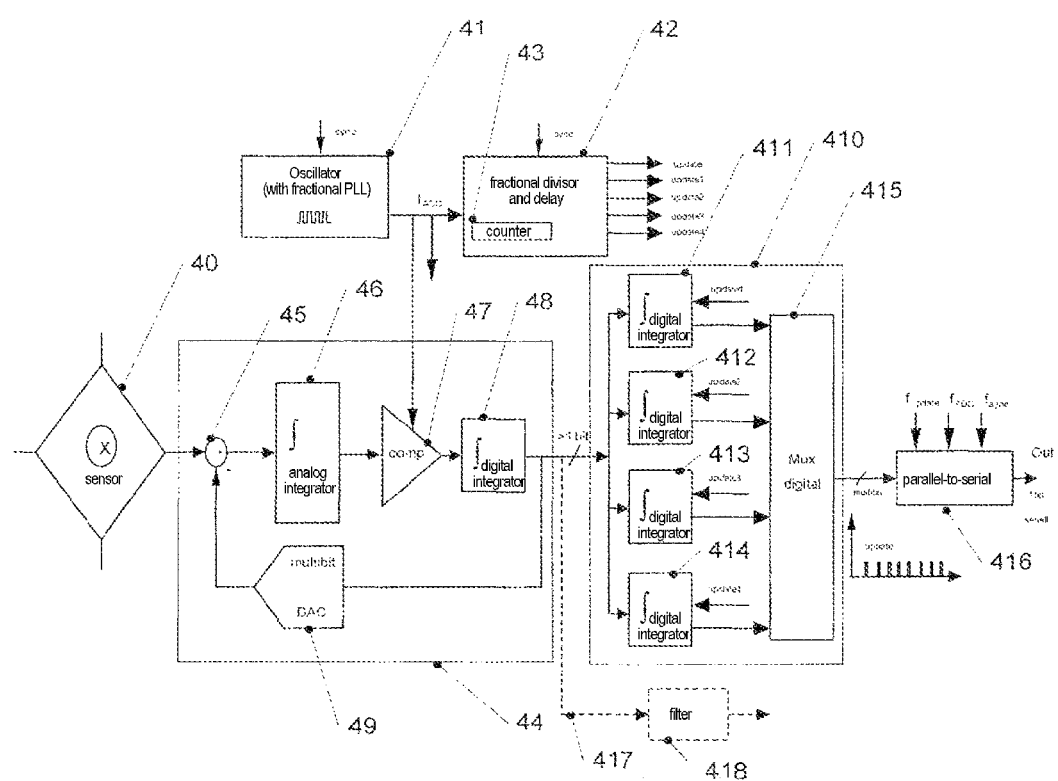
FIG. 4 is a block diagram showing an apparatus according to an exemplary embodiment.

FIG. 4 represents a block diagram for illustrating a further exemplary embodiment. In the exemplary embodiment of FIG. 4, a current is measured using a sensor 40, in the represented example using a Hall sensor. The current can be for example a current in an electric motor or a current in a rectifier, for example a rectifier of a solar cell, but is not limited thereto. Instead of the Hall sensor 40, a different type of sensor can also be used, for example an XMR magnetic field sensor or a sensor based on a voltage measurement via a defined resistance.

In the exemplary embodiment of FIG. 4, an output signal of the sensor is supplied to an analog-to-digital converter 44. In the exemplary embodiment of FIG. 4, the analog-to-digital converter 44 is a multibit sigma-delta analog-to-digital converter with digital tracking and a multibit output, as is indicated in FIG. 4 by way of the designation ">1 bit." In the exemplary embodiment of FIG. 4, the analog-to-digital converter 44 is additionally a continuous-time analog-to-digital converter. In different exemplary embodiments, different types of analog-to-digital converters can be used, for example analog-to-digital converters with switched capacitors or different types of sigma-delta analog-to-digital converters.

The analog-to-digital converter 44 comprises a subtractor 45, wherein a signal of the sensor 40 is supplied to a positive input of the subtractor 45 and the output signal of the analog-to-digital converter 44 is supplied to a negative input of the subtractor 45 via a feedback loop with a multibit digital-to-analog converter 49. The multibit digital-to-analog converter (DAC) 49 here serves for converting the digital output signal into an analog signal.

An output signal of the subtractor 45 is supplied to an analog integrator 46. An output signal of the analog integrator 46 is supplied to a multistage comparator 47, which samples the output signal of the analog integrator 46 with a converter clock frequency $f_{ADC}$ and compares it for example with a plurality of threshold values in order to output, in dependence on this comparison, an associated value of a multibit digital signal (for example a 2-bit signal, 3-bit signal, 4-bit signal and the like). An output signal of the comparator 47 is then integrated by a digital integrator 48 in order to form the output signal of the analog-to-digital converter 44. A sigma-delta analog-to-digital converter of the construction illustrated in FIG. 4 here has an inherent lowpass filter function with which peaks, such as for example of the curve 31 in FIG. 3, can already be suppressed at least up to a certain degree.

The output signal of the analog-to-digital converter 44 is supplied to a block 410 for averaging. The block 410 in this case comprises four digital integrators 411-414, which integrate the output signal of the analog-to-digital converter 44 in each case over a period duration of a disturbance, wherein the averaging by way of the four integrators 411-414 takes place with a time offset in the exemplary embodiment of FIG. 4. The digital integrators 411-414 are here controlled, as represented, by signals update1 to update4, which are generated in a device 42. The device 42 receives the analog-to-digital converter clock signal with the frequency $f_{ADC}$ and a synchronization signal sync, which indicates a period duration of the disturbance, and on the basis of this generates the signals update1 to update4 and optionally a signal update. These signals specify the start and end of the averaging periods to the integrators 411-414. To this end, the device 42 comprises a counter 43, which counts the number of clock cycles of the analog-to-digital converter clock signal during a period of the synchronization signal sync, as already explained with reference to FIG. 1. By way of a delay, the different signals update1 to update4 are then generated. A multiplexer 415 then outputs, for example controlled by the signal update, the output signals of the integrators 411-414 in alternation. The multibit output signal of the multiplexer 415 can then optionally also be supplied to a parallel-to-series converter 416, which generates a serial 1-bit output signal out on the basis of an updating frequency $f_{update}$, the analog-to-digital converter clock frequency $f_{ADC}$ and/or a synchronization frequency $f_{sync}$ of the synchronization signal sync. In other exemplary embodiments, the multibit signal which is output by the multiplexer 415 can also be used directly as the output signal.

For producing the analog-to-digital converter clock signal, an oscillator 41 with a fractional phase-locked loop (PLL) can additionally be optionally used, with which the clock signal can be matched up to a specific degree to the synchronization signal sync. Depending on the analog-to-digital converter used, the option for matching can be limited here. For example, in a sigma-delta analog-to-digital converter, as represented in FIG. 4, only a matching by a few percent can typically take place without stability problems being produced. With such matching, it is possible for example for the clock frequency $f_{ADC}$ to be matched such that there is an integer number of sampling values in a period of disturbances, for example $f_{ADC}$ is an integer multiple of a frequency of the disturbances.

While four integrators 411-414 are used in the exemplary embodiment of FIG. 4 to form four offset average values, in other exemplary embodiments it is also possible to use a different number of integrators.

As indicated by a dashed arrow 417, the output signal of the analog-to-digital converter 44 can additionally optionally be used for other purposes. For example, this output signal can be supplied to a digital filter path 418, via which for example an amplitude of the "ripples" or other properties of the "ripples," i.e. the disturbances, can be monitored. By such monitoring it is possible, for example in the case of motor control, to detect malfunctions of the motor, for example blocking of the motor.

Figure 5:
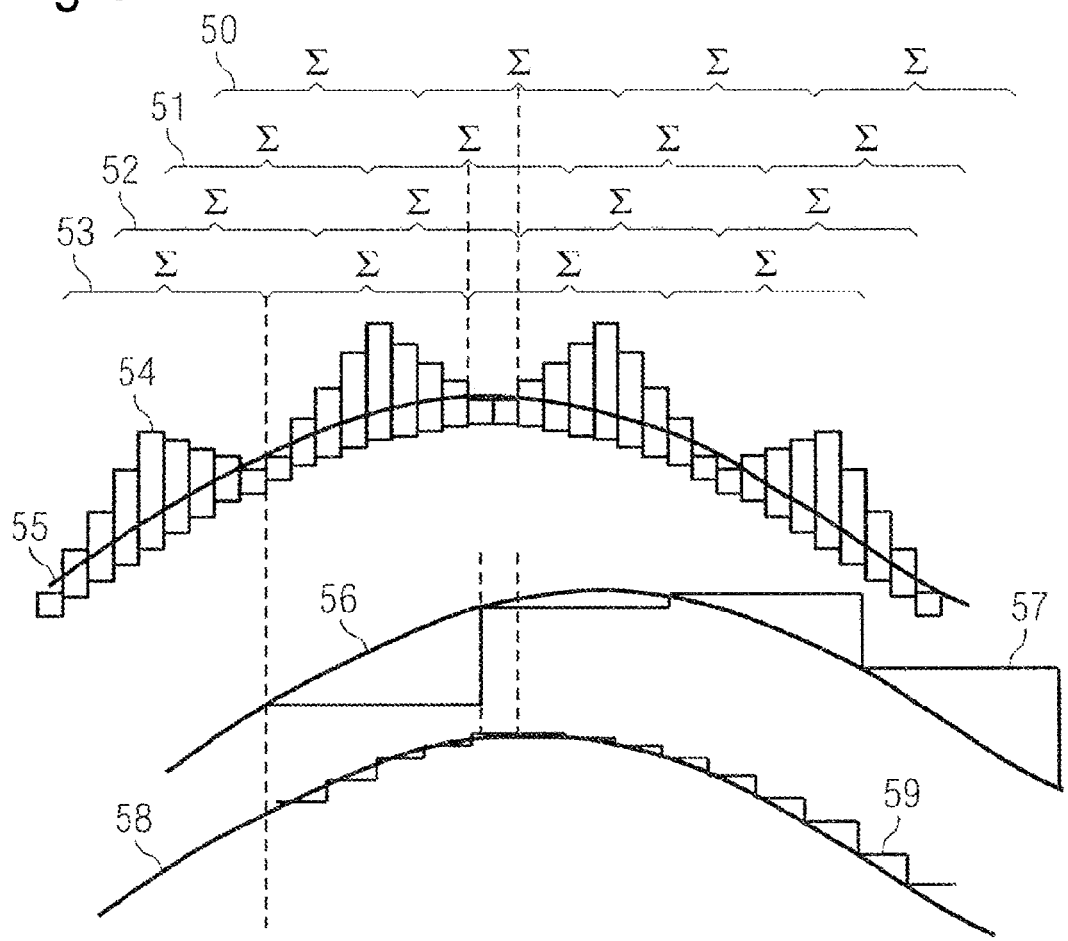
FIG. 5 is a diagram for illustrating the work method of exemplary embodiments.
Figure 6:
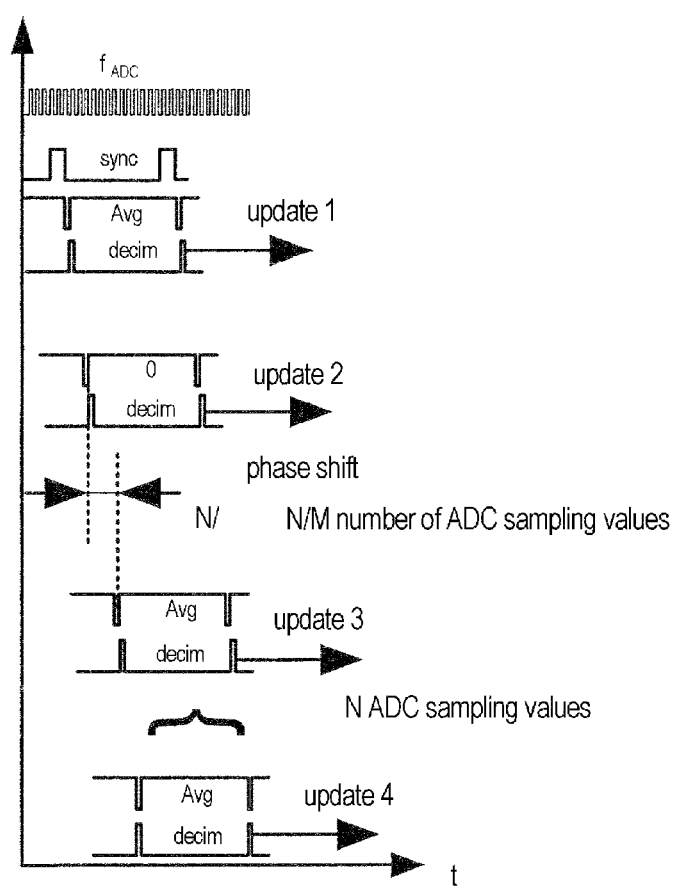
FIG. 6 is a diagram with signals for illustrating exemplary embodiments.

In order to further illustrate the mode of function of the exemplary embodiment of FIG. 4, FIGS. 5 and 6 schematically show examples of possible signal profiles. These examples merely serve for illustration purposes, and depending on the use and implementation, the signal profiles can also have other shapes.

A curve 55 shows a disturbance-free signal profile, in this case a sinusoidal signal profile. In the example of FIG. 5, the sinusoidal signal profile is superimposed with triangular disturbances, which result in sampling values 54 at the output of a digital-to-analog converter, such as the digital-to-analog converter 44 in FIG. 4. Parentheses 53, designated Σ, indicate averaging in each case over a period of the disturbances. This corresponds to the averaging by a single integrator, for example the integrator 411 of FIG. 4. On the basis of these average values, a curve is produced, for example, from which a sine wave curve 56 can then be reconstructed. As compared to the original curve 55, the curve 56 has a relatively large delay.

Parentheses 50-52 and the parenthesis 53 in FIG. 5 illustrate the temporally offset averaging by a plurality of integrators, for example four integrators, as represented in FIG. 4 (integrators 411-414). Averaging is thus started 4 times in each period of the disturbances. This results in an output signal, as indicated by a curve 59, from which in turn a sinusoidal signal 58 can be reconstructed. This sinusoidal signal 58 has, as compared to the curve 55, a significantly smaller delay than the curve 56. In consequence, it is possible in exemplary embodiments to reduce, by way of a temporally offset averaging, a delay of the output signal which can be useful for example when used in control loops, i.e. if the measurement variable is controlled on the basis of the output signal. In applications in which the delay is non-critical, it is also possible for example to implement a configuration with a single averaging, for example a single integrator.

In some exemplary embodiments, it is possible by way of the represented averaging for a smaller delay in the generation of the output signal to be achieved than in other procedures, for example when using a lowpass filter with an analog-to-digital converter that is connected downstream.

FIG. 6 illustrates synchronization of the updating rate of the output signal to the synchronization signal sync and the determination of the number N of sampling values of the phase shift between the signals update1 to update4. FIG. 6 here shows the converter clock signal with the frequency $f_{ADC}$ and an example of a synchronization signal. The duration of the averaging can be, for example, from one falling flank of the synchronization signal to the next falling flank of the synchronization signal. Examples of corresponding signals of FIG. 4, which in each case extend over N sampling values, are designated with update1 to update4. The phase shift between two of these update signals is then N/M sampling values, with M representing the number of update signals (4 in the example).

A resulting updating rate $f_{update}$ can thus be a multiple of the frequency of the disturbances, for example, as represented, four times the frequency of the disturbances. To give examples of numerical values, for example the frequency $f_{ADC}$ can be of the order of magnitude of 10 MHz, and the multibit output signal of the digital-to-analog converter can be a 6-bit output signal with sampling values which are produced in this example with time spacings of 100 ms. At a frequency of the synchronization signal $f_{sync}$ (corresponding to the frequency of the disturbances) of 50 kHz and four temporally offset averagings, as represented, a delay, as represented in FIG. 5 for the curve 58, would be for example 5 μs. Forming the average would be effected over 200 sampling values, wherein the average rating over 200 6-bit sampling values would lead to an effective resolution of approximately 14 bit. The updating rate in this example would be 200 kHz. The updating rate $f_{update}$ is generally greater than or equal to the frequency of the disturbances $f_{ripple}$, but significantly smaller than the frequency of the analog-to-digital converter clock signal $f_{ADC}$. This can reduce electromagnetic emission of the output power.

With these numerical values, the oscillator 41 can serve for example for matching the frequency $f_{ADC}$ between two neighboring integer values of the fractional divisor, i.e. for example between 50 or 51 in the case discussed above $f_{ADC}$=10 MHz, $f_{update}$=200 kHz, $f_{ripple}$=$f_{sync}$=50 kHz. This results in an effective delay of 10 μs and an update period of 5 μs. In this case, it is necessary to indicate for example the internal oscillator only by 2%. The above numerical values only serve for illustration purposes, and depending on the implementation and use, other values are possible.

The above-discussed exemplary embodiments only serve as examples, and various modifications and variations are possible. By way of example, the averaged output signal (for example the output signal of the block 12 in FIG. 2 or the block 410 of FIG. 4) can be subjected to further filtering. In such filtering, previous output values with weighting factors can be added, for example by means of a triangular filter, in which a preceding output signal is weighted with ½, the output signal before that with ¼ etc. In the example of FIG. 5, such filtering can also be effected on the basis of the offset averagings, for example an instantaneous, i.e. just output sum signal 50+½ times a preceding sum signal 51+¼ times a preceding sum signal 52+⅛ times a preceding sum signal 53+1/16 times a preceding sum signal 50. It is also possible to take into account more or fewer preceding sum signals. As a result, the filtering of disturbances can be improved further, while on the other hand a delay is increased by this procedure in exemplary embodiments.

In other exemplary embodiments, additionally or alternatively, a prediction algorithm can be used to preset for example the feedback analog-to-digital converter 49 to a target value, which can accelerate processing. In other words, for example in a converter which operates according to the principle of successive approximation, a target value is preset on the basis of a preceding output signal.

In some exemplary embodiments, an analog-to-digital converter used, such as the sigma-delta analog-to-digital converter 44 in FIG. 4, can be synchronized with a chopper frequency of a used chopper amplifier and/or with a frequency of what is known as "spinning current" of the Hall sensor 40. In the "spinning current" technique, the ports of the Hall sensor are used in alternation, for example as inputs and outputs, to thus compensate an offset.

In some exemplary embodiments, what is known as a "guard bending" scheme can be used to reduce the influence of peaks, in which for example the first and last sample values of an averaging period are discarded and not included in the averaging, since peaks could occur in particular when switching, for example of the PWM control signal 230. This can be useful in particular when using analog-to-digital converters having switched capacitors, while it has less of an effect in continuous-time sigma-delta converters.

As already mentioned, it is also possible, instead of using a synchronization signal, to determine the time duration of the averaging directly from the measurement variable by way of ascertaining a period of the disturbances.

In addition, in the represented example, a single-phase disturbance, i.e. for example a single-phase PWM control signal 32 in FIG. 3, was used. In other exemplary embodiments, multiphase signals can be used, which then correspondingly influences the disturbances. In this case, a synchronization signal is present, if appropriate, only for one of the phases, and can then be ascertained for the other phases by phase shift in order to eventually determine respective averaging periods on the basis of the synchronization signals.

As can be seen, many variations and modifications of the illustrated exemplary embodiments are thus possible. These should thus not be understood to be limiting.

The invention claimed is:

1. Apparatus for processing a measurement signal, the apparatus comprising:
   an analog-to-digital converter configured to receive a measurement signal and output digital sampling values that represent the measurement signal, wherein the measurement signal corresponds to a base signal that exhibits noise-induced ripple through unintentional overlap with a periodic disturbance, and
   an averaging device configured to carry out a multiplicity of averages of the digital sampling values over a time duration corresponding to a period duration of the periodic disturbance, wherein the multiplicity of averages are phase-shifted by a fraction of the period duration of the periodic disturbance.

2. Apparatus according to claim 1, wherein the analog-to-digital converter comprises a multibit analog-to-digital converter.

3. Apparatus according to claim 1, wherein the analog-to-digital converter comprises a continuous-time sigma-delta analog-to-digital converter.

4. Apparatus according to claim 1, wherein the averaging device comprises a digital integrator.

5. Apparatus according to claim 1, wherein the analog-to-digital converter is configured to be clocked by an analog-to-digital converter clock signal, wherein the apparatus further comprises a counter that is configured to determine a number of periods of the analog-to-digital converter clock signal during a period duration of the periodic disturbance to determine a number of digital sampling values for the averaging over the time duration which corresponds to the period duration of the periodic disturbance.

6. Apparatus according to claim 5, wherein the counter is configured to receive a synchronization signal which indicates information relating to the period duration of the periodic disturbance.

7. Apparatus according to claim 5, further comprising an oscillator device configured to generate the analog-to-digital converter clock signal, wherein the oscillator device comprises a control device that is configured to control a frequency of the analog-to-digital converter clock signal such that, within the period duration, an integer number of digital sampling values is present.

8. Apparatus according to claim 1, further comprising a sensor for providing the measurement signal.

9. Apparatus according to claim 8, wherein the sensor comprises a current sensor.

10. Apparatus according to claim 1, wherein the averaging device is configured to discard at least one digital sampling value at at least one of a start and an end of an averaging period.

11. Apparatus according to claim 1, wherein the apparatus is configured to carry out filtering on the basis of the multiplicity of averages of the averaging device.

12. Apparatus according to claim 1, further comprising a filter device coupled to an output of the analog-to-digital converter to monitor the periodic disturbance.

13. Apparatus according to claim 1, wherein the averaging device comprises:
   a first digital integrator configured to form a first average value of the digital sampling values over the time duration; and
   a second digital integrator to form a second average value of the digital sampling values over the time duration, wherein the second average value takes place with a time offset from the first average value.

14. Apparatus for processing a measurement signal, the apparatus comprising:
   an analog-to-digital converter configured to receive a measurement signal and output digital sampling values that represent the measurement signal, wherein the measurement signal corresponds to a base signal that exhibits noise-induced ripple through unintentional overlap with a periodic disturbance, and
   an averaging device configured to:
      discard at least one digital sampling value at at least one of a start and an end of a time duration corresponding to a period duration of the periodic disturbance; and
      form an average value of digital sampling values over the time duration.

15. Apparatus according to claim 14, wherein the averaging device is further configured to form a plurality of temporally offset average values of the digital sampling values over the time duration, wherein the temporal spacing of the average values corresponds to a fraction of the period duration.

16. Apparatus according to claim 14, wherein the averaging device comprises:
   a first digital integrator configured to form a first average value of the digital sampling values over the time duration; and
   a second digital integrator to form a second average value of the digital sampling values over the time duration, wherein the second average value takes place with a time offset from the first average value.

17. Apparatus according to claim 14, further comprising a counter configured to determine a number of periods of an analog-to-digital converter clock signal during the period duration of the periodic disturbance to determine a number of digital sampling values for the averaging over the time duration which corresponds to the period duration of the periodic disturbance.

18. Apparatus for processing a measurement signal, the apparatus comprising:
   an analog-to-digital converter configured to receive a measurement signal and output digital sampling values that represent the measurement signal, wherein the measurement signal corresponds to a base signal that exhibits noise-induced ripple through unintentional overlap with a periodic disturbance,
   an oscillator device configured to generate an analog-to-digital converter clock signal to clock the analog-to-digital converter, the oscillator device comprising a control device that is configured to control a frequency of the analog-to-digital converter clock signal such that within a periodic duration of the periodic disturbance an integer number of digital sampling values is present,
   a counter that is configured to determine a number of periods of the analog-to-digital converter clock signal during the period duration to determine a number of digital sampling values for averaging over a time duration which corresponds to the period duration, and
   an averaging device configured to form an average value of digital sampling values over the time duration.

19. Apparatus according to claim 18, wherein the averaging device is further configured to form a plurality of temporally offset average values of the digital sampling values over the time duration, wherein the temporal spacing of the average values corresponds to a fraction of the period duration.

20. Apparatus according to claim 18, wherein the averaging device comprises:
   a first digital integrator configured to form a first average value of the digital sampling values over the time duration; and
   a second digital integrator to form a second average value of the digital sampling values over the time duration, wherein the second average value takes place with a time offset from the first average value.

* * * * *